(12) United States Patent
Barge et al.

(10) Patent No.: US 7,648,888 B2
(45) Date of Patent: Jan. 19, 2010

(54) APPARATUS AND METHOD FOR SPLITTING SUBSTRATES

(75) Inventors: Thierry Barge, Grenoble (FR); Walter Schwarzenbach, Saint-Nazaire-les-Eymes (FR); Jean-Marc Waechter, Saint-Vincent-de-Mercuze (FR); Thuan Truong, Domène (FR); Bruno Ghyselen, Seyssinet-Pariset (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 485 days.

(21) Appl. No.: 11/337,655

(22) Filed: Jan. 24, 2006

(65) Prior Publication Data

US 2006/0138189 A1     Jun. 29, 2006

Related U.S. Application Data

(60) Division of application No. 10/775,865, filed on Feb. 9, 2004, now Pat. No. 7,017,570, which is a continuation of application No. PCT/FR02/02646, filed on Jul. 24, 2002.

(30) Foreign Application Priority Data

Aug. 7, 2001   (FR) .................................. 01 10537

(51) Int. Cl.
  *H01L 21/46* (2006.01)
(52) U.S. Cl. ........................... 438/458; 83/29; 156/584; 125/23.01; 125/40
(58) Field of Classification Search ................ 83/29; 438/458; 156/584
See application file for complete search history.

(56) References Cited

U.S. PATENT DOCUMENTS

| | | | | |
|---|---|---|---|---|
| 3,901,423 | A | 8/1975 | Hillberry et al. | ................ 225/2 |
| 4,244,348 | A | 1/1981 | Wilkes | .................... 125/23.01 |
| 5,374,564 | A | 12/1994 | Bruel | ........................... 437/24 |
| 5,783,022 | A * | 7/1998 | Cha et al. | .................... 156/344 |
| 5,811,348 | A * | 9/1998 | Matsushita et al. | .......... 438/455 |
| 5,897,743 | A * | 4/1999 | Fujimoto et al. | ............ 156/584 |
| 5,994,207 | A * | 11/1999 | Henley et al. | ............... 438/515 |
| 6,077,383 | A * | 6/2000 | Laporte | ...................... 156/344 |
| 6,100,166 | A * | 8/2000 | Sakaguchi et al. | .......... 438/455 |

(Continued)

FOREIGN PATENT DOCUMENTS

EP        0 867 917 A2    9/1998

(Continued)

*Primary Examiner*—A. Sefer
*Assistant Examiner*—Allen L Parker
(74) *Attorney, Agent, or Firm*—Winston & Strawn LLP

(57) ABSTRACT

The invention relates to a method of splitting apart a substrate of two adjoining wafers defining between them a cleavage plane, by bringing each substrate into a substrate-receiving space; and clamping first and second jaw portions onto each substrate in such a manner as to hold each substrate and urge apart the two wafers of each substrate by co-operation between the shapes of housings in first and second portions of the two jaws, respectively. The invention also relates to a splitting method that includes bringing each substrate into a substrate-reception space; clamping together separator portions onto each substrate so as to split apart the two wafers of each substrate; and clamping the split-apart substrate wafers so as to hold the wafers together. An automated system for processing multiple substrates is also provided.

21 Claims, 7 Drawing Sheets

U.S. PATENT DOCUMENTS

| | | | |
|---|---|---|---|
| 6,171,965 B1 * | 1/2001 | Kang et al. | 438/695 |
| 6,286,685 B1 * | 9/2001 | Kononchuk et al. | 209/2 |
| 6,382,292 B1 | 5/2002 | Ohmi et al. | 156/584 |
| 6,415,843 B1 * | 7/2002 | De et al. | 156/584 |
| 6,427,748 B1 | 8/2002 | Yanagita et al. | 156/584 |
| 6,468,879 B1 | 10/2002 | Lamure et al. | 438/458 |
| 6,475,323 B1 | 11/2002 | Ohmi et al. | 156/239 |

FOREIGN PATENT DOCUMENTS

| | | |
|---|---|---|
| EP | 0 977 242 A2 | 2/2000 |
| JP | 62237744 A * | 10/1987 |
| JP | 04-010454 A2 | 1/1992 |
| JP | 07-240355 A2 | 9/1995 |
| JP | 09-069552 A2 | 3/1997 |

* cited by examiner

FIG._3

FIG_4

FIG_6

APPARATUS AND METHOD FOR SPLITTING SUBSTRATES

CROSS-REFERENCE TO RELATED APPLICATION

This application is a division of application Ser. No. 10/775,865 filed Feb. 9, 2004, now U.S. Pat. No. 7,017,570 which is a continuation of International application PCT/FR02/02646 filed Jul. 24, 2002, the entire content of each of which is expressly incorporated herein by reference thereto.

BACKGROUND ART

The present invention relates in general to processing materials, and more particularly to processing substrates for electronics, optics, or optoelectronics. More precisely, the invention relates to apparatus enabling two wafers of material initially adjoining each other to be split apart in a splitting plane. The invention also relates to a method implemented by such apparatus.

As explained below, the invention applies to wafers of material which adjoin with varying degrees of cohesion. The term "adjoining" wafers is used to mean wafers positioned in such a manner as to be in physical contact. Thus, "adjoining" wafers can still be connected together by structural elements (in particular for wafers that define between them a plane of weakness as described below, which plane of weakness has been subjected to treatment, e.g. heat treatment, that does not achieve complete cleaving between the two wafers on either side of the plane); or on the contrary need not be connected together by any structural element, but instead are held together solely by means of forces such as those corresponding to a "suction-cup" effect between the adjoining but disjoint surfaces of the two wafers, or by Van der Waals forces (in particular to wafers coming initially from the same substrate, with a plane of weakness being defined between them, which plane of weakness has been subjected to heat or other treatment enabling complete cleaving to be obtained between the two materials on either side of the plane of weakness). The two adjoining wafers thus form an assembly referred to below as a substrate.

A known method of manufacturing SOI type substrates which is known under the generic term of the SMARTCUT® method, comprises the following principal steps:

a step of implanting species (ions or atoms) to a given depth in a substrate of semiconductor material such as monocrystalline silicon, so as to define a plane of weakness in the substrate;

a step of fixing the substrate to a stiffener, such as, for example, silicon that has optionally been oxidized on its surface; and then a cleaving step for imparting a fracture in at least a part of the plane of weakness defined at the level of the layer of implanted species. There is thus one wafer on either side of the fracture (a first wafer corresponding to the portion of the monocrystalline silicon substrate which has been detached and possibly also fixed to a stiffener so as to constitute the SOI, and a second wafer which corresponds to the remainder of the silicon).

In some cases, if the two wafers of substrate situated on either side of the plane of weakness are sufficiently thick themselves to present some minimum level of strength, then the step of fixing to a stiffener can be omitted.

It is also possible to grow a silicon substrate directly on the stiffener instead of fixing the substrate to the stiffener.

An example of a general description of a method of that type can be found in U.S. Pat. No. 5,374,564. In that type method, regardless of whether the fracture implemented during the cleaving step is complete or only partial, the two wafers remain, in practice, adhering to each other merely by the suction-cup effect when the fracture is complete, given that the faces of the wafers are extremely smooth.

It thus remains necessary in these cases to finally split them apart in order to obtain firstly the final SOI substrate and secondly the remainder of monocrystalline silicon, which can be recycled in the method.

It is also recalled that although that patent generally discusses splitting apart pairs of wafers in which one of the wafers corresponds to SOI, there are other requirements for splitting or separating wafers that are adhered or adjoined to each other.

The problem of adhesion between two wafers, even if only by the suction-cup effect, is to be found in numerous two-wafer structures, and for this reason it is necessary to split them. Thus, any or a wide variety of different wafer structures exhibit this feature, including the known SOI, SOA, or AOA types, and splitting is required to separate the wafers for further processing or use.

When the dimensions (in particular the thickness) of the wafers make them fragile, and/or when the material of the wafers is not strong, the two wafers must naturally be split apart while taking very great precautions to avoid running the risk of damaging the two wafers as the wafers are being moved apart from each other, where necessary while also implementing or finishing off the fracture.

This applies in particular when splitting an SOI substrate apart from the remaining monocrystalline silicon. In this application, the splitting-apart operation is generally performed manually by an operator who is particularly skilled. For example, the operator can insert a sharp blade or the like into the edge of the silicon substrate level with a cleavage plane (which corresponds to the plane of weakness), thus making it possible by a wedging effect to split the wafers apart. That operation runs the risk of inducing impacts or rubbing between the facing faces of the two wafers, and thus of damaging them. In addition, that manual operation is lengthy and fiddly, and rates of production throughput depend thereon to a great extent.

Finally, particularly when the fracturing between the two wafers needs to be finished off by the process of splitting the wafers apart, the forces delivered to the substrate need to be large, and the above-mentioned manual operation becomes ill-suited or even dangerous. It will thus be understood that it would be particularly advantageous to be able to propose a method and apparatus enabling wafers to be split apart quickly, reliably, and reproducibly, and which also avoids any contact between the faces of the wafers while they are being split apart so as to prevent any risk of scratching or of particles being deposited on the faces of the wafers.

In this regard, U.S. Pat. No. 6,468,679 describes a method and apparatus seeking to satisfy that need. While this is useful for its intended purpose, there still is a need for further improvements in this area.

Other apparatuses are known for the purpose of splitting wafers apart from a semiconductor substrate. For example, U.S. Pat. No. 6,382,292 discloses an apparatus seeking to split apart a wafer by a fluid jet. It should be observed that the technology implemented for fluid jet splitting is specific and corresponds to a very particular option. One limitation associated with that option is the need to provide sophisticated means for holding the substrate to be split apart in extremely accurate manner relative to a jet of fluid which is applied to the edge of the substrate. That requires the wafer faces that are to be split apart to be subjected to stresses that can generate irregularities in the structure of the wafers after splitting. In addition, that patent document does not provide any solution that would enable a plurality of wafers that have just been split apart to be handled in simple manner.

JP 04 010 454 also relates to a technique of splitting wafers apart by a fluid jet. That document proposes a highly specific sequence seeking to split wafers apart individually from substrates. In particular, provision is made for selectively turning over certain substrates, thereby making the splitting method more complex.

U.S. Pat. No. 6,427,748 also describes a variant in which use is made of ultrasound for splitting wafers apart from a substrate. In that case also, the technology used is very specific to the intended use. Furthermore, entirely particular means need to be provided and a complex method of operation is associated with such treatment. In particular, it is necessary to place the substrate that is to be treated in an enclosure for exposing it to ultrasound, and then to remove the separated wafers from the enclosure, corresponding to handling operations that are fiddly.

Mention can also be made, for information purposes, of document JP 09 069 552 as a document that teaches no more than an apparatus for handling substrates, but not for splitting wafers apart.

In view of the above, it is clear that there is a need for a new method and apparatus for splitting adjoined substrates, and these are now provided by the present invention.

SUMMARY OF THE INVENTION

The present invention relates to a method of splitting apart a substrate comprising two adjoining wafers defining between them a cleavage plane, which comprises bringing each substrate into a substrate-receiving space; and clamping first and second jaw portions onto each substrate in such a manner as to hold each substrate and urge apart the two wafers of each substrate by co-operation between the shapes of housings in first and second portions of the two jaws, respectively.

In this method, during the clamping, co-operation between the shapes of the housings of the first portions of the two jaws also causes controlled offsetting between the two wafers of each substrate in a direction perpendicular to the cleavage plane, with splitting occurring during the controlled offsetting. Preferably, the controlled offsetting of the wafers after they have been split apart includes moving the second portion of each jaw in translation relative to the first portion of each respective jaw in a direction perpendicular to the wafers.

Following the clamping, the method also includes loosening the first and second jaw portions so as to release the separated wafers, while other jaws are clamped together so as to retain only certain wafers of the substrate. When one wafer of each substrate is retained, the other wafer being recovered by a pusher, so that for each split substrate the wafers may be placed in separate containers.

The substrates generally include a zone of weakness between a first SOI wafer and another wafer of semiconductor material, with the substrates being split along the zone of weakness. The substrates may be held apart by means of a guide prior to splitting the substrates. Thereafter, at least some of the split-apart substrate wafers can be clamped to hold those wafers together for further handling.

Another aspect of the method of splitting comprises bringing each substrate into a substrate-reception space; clamping together separator portions onto each substrate so as to split apart the two wafers of each substrate; and clamping the split-apart substrate wafers so as to hold the wafers together. Prior to clamping, the split-apart wafers are advantageously held in generally V-shaped housings. Also, prior to splitting the substrates can be held apart by means of a guide. After splitting, the clamped wafers can be additionally clamped so that only certain wafers are retained. Then, the method can further include retaining one wafer of each substrate and recovering the other wafer of each substrate, placing the first split-apart wafer in a first container and placing the second split-apart wafer in a second container for shipment.

Yet another embodiment is a method of splitting which comprises manipulating a plurality of substrates disposed in a substrate-storage direction so as to bring them into registration; splitting the substrates into wafers; and imparting controlled displacement to certain wafers in a direction substantially parallel to the substrate-storage direction. This further comprises handling the wafers in two batches, each batch comprising a respective wafer from each substrate, and depositing each of the two batches in a respective location.

The invention also relates to various devices that can be used to carry out the present methods. These apparatus and methods facilitate a clean splitting of the wafers from the substrates in an efficient manner.

BRIEF DESCRIPTION OF THE DRAWINGS

Other aspects, objects, and advantages of the invention appear better on reading the following description of preferred embodiments of the invention, made with reference to the accompanying drawings, in which:

FIG. 1 is a diagrammatic overall front view of the first machine, in which view a perspective direction P1 is defined;

FIG. 2 is a more detailed view of a portion of the first machine in perspective looking along P1;

FIG. 3 is an even more detailed view of two elements of the first machine as shown in FIG. 2;

FIG. 4 is a detail view of another portion of the first machine;

FIG. 5 is a diagrammatic overall view of the second machine in elevation view from above;

FIG. 6 is a diagrammatic view of a substrate positioned relative to certain essential elements of the second machine; and FIGS. 7 and 8 are two diagrammatic views of a substrate showing the positioning of the substrate relative to certain elements of the second machine.

DETAILED DESCRIPTION OF THE PREFERRED EMBODIMENTS

Figure 1:
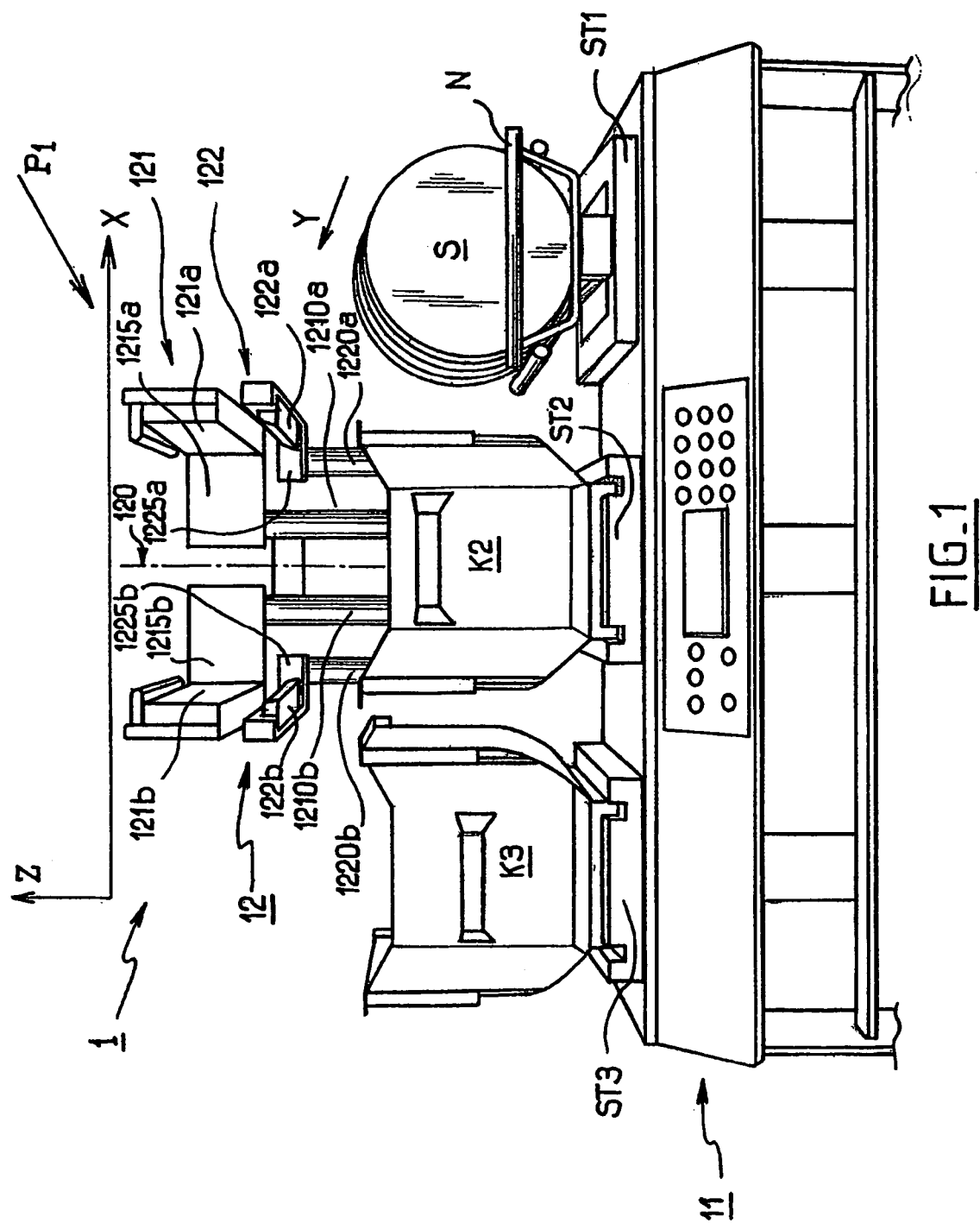
FIGS. 1 to 4 are views of a first machine enabling the invention to be implemented in a first main embodiment. More precisely, in these figures.

The present invention now provides a method and apparatus which is applicable to splitting apart wafers of SOI, SOA or AOA structures. In particular, the present invention seeks to enable even higher rates of production throughput to be achieved during splitting of such substrates.

The invention also seeks to enable wafers to be split apart while imparting as little stress as possible to the faces that are facing away from the cleavage plane between the two wafers.

The invention also enables the first steps of handling the wafers of each substrate after they have been split apart to be performed automatically.

In particular, the invention provides in a first aspect, an apparatus for splitting a substrate apart, the substrate comprising two adjoining wafers defining between them a cleavage plane, the apparatus being characterized in that it comprises means for feeding splitter means with a plurality of substrates disposed in a substrate-storage direction; splitter means for splitting apart the wafers of the substrates, the splitter means comprising moving jaws; and means for performing controlled displacement of certain substrate wafers after they have been split apart in a direction that is substantially parallel to the substrate-storage direction. Thus, the apparatus is suitable for splitting apart the plurality of substrates.

Preferred but non-limiting aspects of the apparatus of the invention are now described. An advantage of the splitter means is that it enables multiple wafers or substrates to be split apart simultaneously or sequentially. Also, the means for feeding substrates comprises a pusher suitable for lifting substrates stored in a cradle-type support.

The splitter means of the apparatus preferably comprises a first jaw-forming comb assembly comprising at least two moving jaws situated on either side of a gap for receiving the substrates; with the jaws being suitable for holding the substrates once the jaws have clamped onto the substrates. Each jaw itself comprises first and second portions, with the two portions of each jaw having corresponding concave housings for receiving and holding the substrates. Also, the shape of the corresponding housings being adapted so that once the first and second portions of the two jaws have clamped onto the substrates, they urge the two wafers of each substrate apart by co-operation between the shapes of the housings of the first portions of the two jaws and the second portions of the two jaws, respectively.

In a preferred embodiment, the two jaws of the first comb assembly are identical. Also, in each jaw of the first comb assembly, each of the concave housings of the first and second jaw portions includes a respective projecting element such as an edge for engaging a substrate at its cleavage plane, the projecting element defining a general plane in which it extends. Advantageously, in each jaw of the first comb assembly, each concave housing of the first jaw portion further presents a profile that is asymmetrical. This profile is present on either side of the projecting element, and includes a first wall oriented at a first general angle of incidence relative to the general plane of the projecting element to co-operate with a first side of the substrate; and a second wall oriented with a second general angle of incidence relative to the general plane of the projecting element to co-operate with a second side of the substrate, which second angle of incidence is greater than the first general angle of incidence. Thus, during clamping of the first jaw portions of the first comb assembly on the substrate, the wafer of the substrate that is on the first side of the substrate presents a degree of freedom to move relative to the first portions and in a direction perpendicular to the general plane of the projecting element that is smaller than the degree of freedom to move presented by the substrate wafer which is on the second side of the substrate.

Alternatively, in each jaw of the first comb assembly, each concave housing of the second jaw portion further presents a profile that is asymmetrical and comprises, on either side of the projecting element, a first wall oriented with a first general angle of incidence relative to the general plane of the projecting element to co-operate with the second side of the substrate, and a second wall oriented with a second general angle of incidence relative to the general plane of the projecting element to co-operate with the first side of the substrate, which second angle of incidence is greater than the first general angle of incidence. During clamping of the second jaw portions of the first comb assembly on the substrate, this allows the substrate wafer on the second side of the substrate to present a degree of freedom to move relative to the second portions and in the direction perpendicular to the general plane of the projecting element that is smaller than the degree of freedom to move presented by the substrate wafer which is on the first side of the substrate, so as to urge the two wafers apart during clamping of the first comb assembly on the substrate.

In another preferred embodiment, in each jaw of the first comb assembly, the first portion comprises two members that are disposed on either side of the second portion, with the second portion being movable relative to the first portion. The means for achieving controlled displacement of certain substrate wafers after they have been split apart preferably comprises means for moving the second portion of each jaw in translation relative to the first portion of each respective jaw in a direction perpendicular to the general plane of the projecting element.

The apparatus may include a second comb assembly having jaws that can be clamped onto the substrates independently of the first and second portions. This second comb assembly can include a plurality of passages for allowing certain wafers to pass through. In an advantageous embodiment, the apparatus further comprises three stations, including a first station for receiving at least one substrate to be split apart, and two stations, each for receiving a respective wafer from each split-apart substrate. Thus, the comb assembly(ies) is/are mounted to move relative to the stations and means are provided for displacing the comb assembly(ies) to be in register with each station, selectively.

Also, each station is preferably provided with a respective pusher, with the pusher associated with the first station having housings for receiving the substrates, and the pusher associated with the other stations having housings for receiving respective ones of the wafers obtained by splitting apart each substrate. Furthermore, each housing of the pusher associated with the first station can include a projecting element in its middle region for engaging the substrate at its cleavage plane.

In another arrangement, the apparatus includes a separator suitable for being moved between a position in which the substrates are disengaged from the separator, and a position in which the substrates are attacked by the separator. This can be is used in combination with a first comb comprising at least two moving jaws dedicated to taking hold of the substrates after the substrates have been attacked by the separator. The jaws are suitable for holding the substrates once the jaws have been clamped onto the substrates; and each jaw preferably has housings that are spaced apart in a desired manner so that once the jaws have been clamped onto the substrates, the wafers of the substrates are spaced apart in the desired manner. The separator has can a cross-section in the form of a projecting wedge.

The apparatus may comprise at least two stations, including a station dedicated to splitting substrates and a wafer dedicated to unloading the split-apart wafers. In this embodiment, each station is provided with a respective pusher, with the pusher of the station dedicated to splitting substrates having housings for receiving the substrates. These housings have a cross section presenting a generally V-shaped profile, or can have a W-shape with a central edge being provided in the bottom of each.

The apparatus preferably comprises a second comb having jaws suitable for being clamped onto the substrates independently of the first and second portions. This second comb can further include a plurality of passages for allowing certain wafers to pass through, and a guide for positioning the substrates in accurate manner.

In other aspects, the invention provides methods of splitting apart a substrate comprising two adjoining wafers defining between them a cleavage plane. One method comprises manipulating a plurality of substrates disposed in a substrate-storage direction so as to bring them into register with splitter means; and imparting controlled displacement to certain substrate wafers after they have been split apart in a direction substantially parallel to the substrate-storage direction.

In addition to actually splitting the wafers apart, the invention also applies to handling such wafers after they have been split apart. It is specified that the invention applies to all types of wafers of material that are adjoining and that are to be split apart in controlled and precise manner. Thus, the invention applies to splitting apart wafers have a structure of the silicon on insulator (SOI) type, and also of the silicon on anything (SOA) type, or even of the so-called anything on anything (AOA) type. Nevertheless, it should be understood that a particularly advantageous application of the invention as described below by way of non-limiting examples relates to splitting apart wafers of an SOI type structure.

Accordingly, this method includes handling the split-apart wafers so as to constitute two batches, each batch comprising a respective wafer from each substrate, and in depositing each of the two batches in a respective location.

Another method includes bringing each substrate into a substrate-receiving space, and clamping the first and second jaw portions of the first comb assembly onto each substrate in such a manner as to hold each substrate and urge apart the two wafers of each substrate by co-operation between the shapes of the housings in the first portions of the two jaws and the second portions of the two jaws, respectively. During the clamping, co-operation between the shapes of the housings of the first portions of the two jaws also causes controlled offsetting between the two wafers of each substrate in a direction perpendicular to the cleavage plane. Also, splitting can occur during the controlled offsetting.

Following the clamping, the first and second jaw portions of the first comb assembly are loosened so as to release the separated wafers, and the jaws of the second comb assembly are clamped together so as to retain only certain wafers of the substrate. One wafer of each substrate may be retained, while the other wafer is recovered by a pusher. For each split substrate, the first split-apart wafer may be placed in a first container and the second split-apart wafer may be placed in a second container. This allows secure recovery of the split wafers without further damage or contact between them.

Another method comprises bringing each substrate into a substrate-reception space; clamping together the separator portions onto each substrate so as to split apart the two wafers of each substrate; and clamping the jaws onto the split-apart substrate wafers so as to hold the wafers. Prior to clamping the jaws, the split-apart wafers may be held in the generally V-shaped housings of the pusher that were previously described. Also, prior to splitting the substrates apart, the substrates may be held by means of a guide.

In one arrangement, after the jaws have been clamped to hold the wafers, other jaws are clamped onto the same wafers enabling only certain wafers to be retained. This allows one wafer of each substrate to be retained, while the other wafer ca be recovered by a pusher. Thus, for each split-apart substrate, the first split-apart wafer can be placed in a first container while the second split-apart wafer can be placed in a second container. Again, this allows secure recovery of the split wafers without further damage or contact between them.

In another aspect, the apparatus or method of the invention is preferably used for splitting apart substrates obtained by the SMARTCUT® method, wherein a first wafer of the substrate corresponds to an SOI wafer and the other wafer is the remainder of semiconductor material, such as monocrystalline silicon.

The following description is made with reference to a preferred application of the invention which concerns splitting apart substrates that include a cleavage plane defining two wafers, one wafer corresponding to an SOI wafer or an SOA wafer, while the other wafer corresponds to the remaining silicon.

Nevertheless, it is recalled once more that the invention is not limited this application: the invention can thus also apply to any substrate corresponding to a structure of SOI, or of SOA type, and also of AOA type, having two wafers that are separated by a cleavage plane (where cleavage might be practically complete such that the two wafers remain adjoining solely by the suction-cup effect, or where the cleavage might alternatively need to be finished off since other forces of cohesion remain between the two wafers, which forces might be the result of the existence of structural bonds).

It is also emphasized that the wafers of the substrates that are to be split apart may be homogenous or otherwise. In particular, the wafers may include electronic or electro-optical components, which components may be in a finished state or in an intermediate state.

Returning to the preferred application of the invention, each of the substrates that is to be split apart (i.e. having two wafers that are to be split apart) will typically have been subjected to the principal steps of the SMARTCUT® method as described above.

A first wafer thus corresponds to an SOI wafer, while the other wafer corresponds to a remainder of the semiconductor material such as monocrystalline silicon.

The first wafer may also correspond to an SOA wafer, where a fine wafer of silicon has been made in the silicon substrate by creating a cleavage plane, and where the cleaving operation is itself associated with a stiffener of any type (quartz or other).

In any event, it is desired to treat substrates comprising two wafers situated on either side of a cleavage plane, so as to split the two wafers apart from each other.

With reference now to FIG. 1, there can be seen a diagram of a machine 1 corresponding to a first main embodiment of the invention.

It should be understood that in all the figures, where it is necessary to refer to the vertical direction, it is represented by the direction Z.

The machine 1 comprises a fixed base 11 shown in the bottom half of the figure. The base 11 is surmounted by an assembly 12 which is movable in a direction X associated with the machine.

Three stations ST1, ST2, and ST3 are defined on the base 11, with the moving assembly 12 being suitable for moving past each of the three stations.

The station ST1 is for receiving a quartz boat N suitable for containing a plurality of substrates S. A typical content for the boat, as shown by way of example in FIG. 1, is 25 substrates (FIG. 1 shows fewer, solely for reasons of clarity).

The substrates may have a diameter of 200 millimeters (mm).

The substrates S are in alignment in the boat in a substrate-storage direction Y.

Housings are regularly distributed along the substrate-storage direction for this purpose in the boat, so that the substrates are distributed regularly at a given reference pitch.

The boat N may be taken directly from a chamber in which the substrates S have been subjected to heat treatment in order to cause each substrate to cleave into two wafers, or in order to prepare it for cleavage (with one of the wafers being an SOI or an SOA wafer while the other wafer corresponds to the remaining silicon).

As mentioned above, the cleaving of such substrates into two wafers needs to be finished off (in other words the two wafers now need to be split apart from each other).

As explained below, the machine thus makes it possible to split a plurality of substrates apart.

Furthermore, the plurality of substrates may all be split apart simultaneously, or there may be a controlled time interval between the splitting apart of two adjacent substrates. In any event, this significantly improves the rate at which substrates are split apart compared with prior art methods and apparatuses.

The stations ST2 and ST3 are for receiving two respective cassettes K2 and K3.

The cassettes K2 and K3 are of the type commonly used for containing and transporting silicon wafers.

These cassettes likewise contain housings that are regularly spaced apart along their inside walls at the same pitch as the reference pitch for the housings in the boat, in order to receive the wafers obtained by splitting apart the substrates that used to be contained in the boat N (the way the method of splitting the substrates apart takes place is described in detail below).

Each cassette thus contains the same number of housings as the boat (25 in this case), each housing in a cassette serving to receive one of the two wafers obtained by splitting a substrate apart.

The boat N and the two cassettes are disposed on their respective stations in such a manner that the storage direction of the substrates in the boat is parallel to the storage direction of the wafers in the two cassettes.

It should be observed that the two cassettes are disposed opposite ways round: the H-BAR of cassette K2 faces towards the front of the machine (i.e. is facing the observer in the view of FIG. 1), whereas the H-BAR of the cassette K3 faces towards the rear of the machine.

The H-BAR of the boat faces towards the front of the machine.

By convention, the H-BAR defines the end of a container (e.g. a boat or a cassette) that corresponds to the "rear faces" of the substrates or the wafers in the container.

Thus, in such a container, all of the substrates or all of the wafers are disposed in parallel in a storage direction, the rear face of each substrate or of each wafer facing towards the H-BAR end of the container.

It is also recalled that the rear face of a substrate is its face opposite from its active face, i.e. the face on which specific treatments are to be performed (making electronic, optical, or other related structures).

Housings are provided that are regularly spaced apart in the wafer-storage direction in each cassette at a pitch that is equal to the reference pitch as defined by the boat N for receiving the wafers.

Each station ST1, ST2, ST3 is associated with a pusher, which in FIG. 1 is retracted into the base 11.

The pusher of each station can be deployed upwards to engage in openings left empty between the structural elements carrying the housings in the bottom portion of the boat (for the pusher of station ST1) or in the bottom portion of each cassette (for the pushers in stations ST2 and ST3), so as to lift the substrates or the wafers from the boat or the cassette with which they are associated.

Each pusher can thus "pass through" the boat or cassette associated therewith in an upward direction in order to pick up the substrates or wafers that used to be contained therein.

In this respect, the pushers are also provided with concave housings that extend in regularly spaced-apart manner in the storage direction of the substrates or the wafers, at the same pitch as specified above for the pushers associated with ST1 and ST3 (pushers having 25 housings), and at a pitch equal to half the reference pitch for the pusher associated with ST2 (this pusher has 50 housings).

The bottom of each pusher housing which is associated with the station ST1 and the boat N includes a projecting edge which extends along the axis of the housing in the middle of the concave part thereof, so as to pick up the substrate in its cleavage zone, the cleavage zone forming an annular cavity in the periphery of the substrate into which the pusher edge is engaged.

The pushers can also move back down with the substrates or the wafers and deposit the substrates or wafers in the associated boat or cassette, by passing downwards through the openings in the structural elements, with the structural elements intercepting the substrates or the wafers and collecting them in ordered manner in the housings while the pusher continues to move downwards until it is retracted in the base 11.

By way of example, the moving assembly 12 is mounted on rails running parallel to the direction X, with means for controlling the displacement of this portion being provided.

This moving assembly 12 comprises two main portions 121 and 122 which are disposed symmetrically on opposite sides of a midplane 120 of the assembly 12.

On either side of the plane 120, each portion 121, 122 thus comprises a jaw which is suitable to move along a circular arc in a horizontal plane (i.e. parallel to the table top of the base 11) by turning about a vertical arm which carries the jaw.

Thus, the first portion of the assembly 12 has two jaws 121*a*, 121*b* mounted to turn in the horizontal plane on two respective arms 1210*a*, 1210*b* via respective jaw supports 1215*a*, 1215*b* which are at right angles to their associated jaws.

The two arms 1210*a* and 1210*b* are suitable for turning through part of a revolution about their respective axes of symmetry so as to turn the supports 1215*a* and 1215*b*, together with the jaws 121*a* and 121*b* which are rigidly secured to the respective supports.

The turning of the two arms 1210*a* and 1210*b* is synchronized so that the two jaws 121*a* and 121*b* are always positioned symmetrically about the midplane 120, which remains stationary relative to the assembly 12.

As can be seen below in greater detail with reference to FIGS. 2 and 3, these two jaws have housings of a very special shape on their faces which can be brought to face each other when the jaws 121*a* and 121*b* are in the closed position as shown in FIG. 1, which housing are distributed at the same reference pitch as mentioned above in the long direction of the jaws.

The housings in the jaws 121a and 121b are not shown in the diagrammatic view of FIG. 1.

Thus, more precisely, these jaws constitute the two hinged jaws of a comb 121, these two hinged jaws being capable of moving towards each other to close the comb or away from each other to open it.

It is specified that the long direction of these jaws is defined as the direction in the horizontal plane which is parallel to the storage direction of the substrates and the wafers when the boat and the cassettes are disposed as shown in FIG. 1, and when the jaws 121a and 121b are in the closed position (as shown in FIG. 1).

The assembly 12 thus comprises a first comb 121.

In generally similar manner, the assembly 12 also comprises a second comb 122 situated beneath the first comb 121.

The second comb 122 is constituted by jaws 122a and 122b which are mounted to turn in a horizontal plane like the jaws 121a and 121b.

The jaws 122a and 122b are thus secured on respective arms 1220a and 1220b via respective supports 1225a and 1225b to which the respective jaws 122a and 122b are rigidly secured.

The two arms 1220a and 1220b extend vertically and are capable of turning through part of a revolution about their respective longitudinal axes.

In this case also, the turning of the two arms is synchronized so that the two jaws 122a and 122b are always positioned symmetrically about the midplane 120.

These two jaws 122a and 122b also have housings on their faces which can be brought to face each other when the jaws 122a and 122b are in the closed position of FIG. 1, which housings (not shown in the diagrammatic view of FIG. 1) are distributed at the same reference point as mentioned above along the long direction of the jaws.

Nevertheless, the shape of these housings is different from the special shape of the housings in the jaws of the comb 121 as is explained in greater detail below.

The two combs 121 and 122 are independent of each other, and the jaws of each of these two combs can be caused to open and close separately and independently by dedicated control means.

Figure 2:
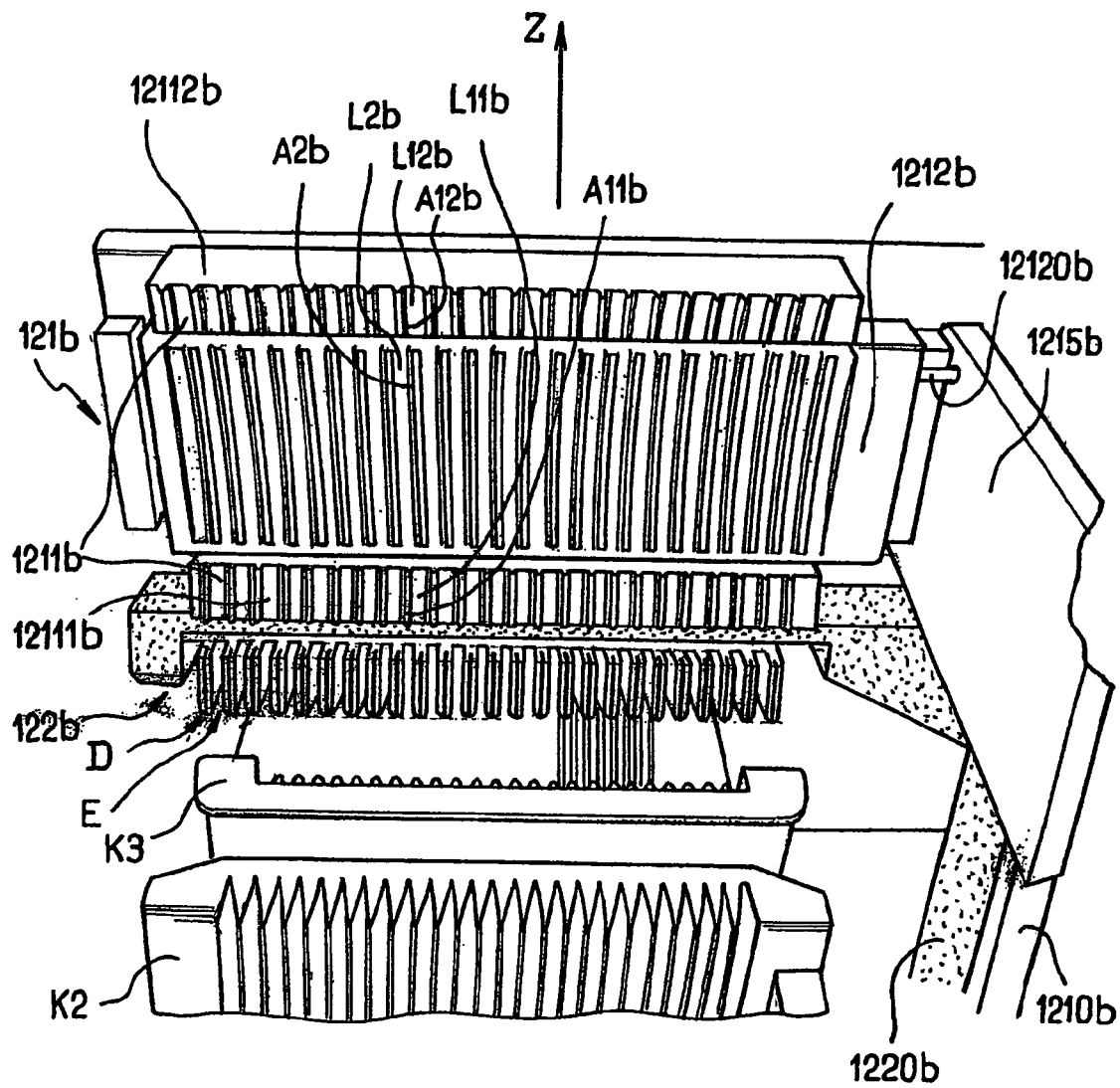

With reference to FIG. 2, the jaws 121b and 122b of respective combs 121 and 122 are shown in greater detail in a diagrammatic perspective view seen looking along direction P1 as defined in FIG. 1.

The assembly 12 is symmetrical about the midplane 120 so that the description below of the jaws 121b and 122b applies in symmetrical manner to the jaws 121a and 122a.

This figure also shows the cassettes K2 and K3 together with the arms 1210b and 1220b on which the respective jaws 121b and 122b are mounted.

The jaw 121b comprises two jaw portions 1211b and 1212b which have the special shapes that are described below.

More precisely, the first portion 1211b comprises two members 12111b and 12112b which are disposed on either side of the second portion 1212b in the vertical direction.

The second portion 1212b is also mounted to move in horizontal translation parallel to the long direction of the jaws relative to the jaw support 1215b via a member for imparting controlled displacement in translation such as a screw 12120b which connects the second portion to the jaw support, with deployment thereof being controllable.

Each of the members 12111b, 12112b and the second jaw portion 1212b have a plurality of concave housings regularly distributed at the above-mentioned reference pitch.

Each of these concave housings of the first and second jaw portions has a central projecting element such as an edge which runs parallel to the direction of the housing, for the purpose of engaging in a substrate at its cleavage plane.

Thus:
each housing L11b of the first member 12111b of the first jaw portion of the first comb 121 has an edge A11b;
each housing L12b of the second member 12112b of the first jaw portion of the first comb 121 has an edge A12b; and
each housing L2b of the second jaw portion of the first comb 121 has an edge A2b.

Each edge thus defines a general plane in which it extends, all of the edges being parallel to one another. The plane in which the edges extend is a vertical plane, perpendicular to the surface of the jaw that is to clamp onto the substrates: this plane thus coincided with the cleavage plane of the substrate when the jaw closes onto the substrate.

A detailed description of these central edges and of their function is given below with reference to FIG. 3.

The number of housings in each member of the first jaw portion, and in each second jaw portion, is preferably equal to the number of housings in the boat N and in the cassettes K2 and K3 of FIG. 1.

These housings are distributed along the length of each member and of each second jaw portion.

The two members 12111b, 12112b are fixed relative to each other and relative to the jaw support 1215b, these two members being rigidly secured to the support.

Each housing of the members 12111b and 12112b extends generally in the vertical direction which corresponds to the long direction of the substrates and the wafers that are going to be manipulated. The same applies to the housings of the second portion 1212b of the jaw of the first comb.

Each housing of the member 12111b extends in line with a corresponding housing of the member 12112b, these two corresponding housings being intended to close onto the same substrate during clamping of the jaws of the first comb 121.

More precisely, each housing L11b, L12b of the respective members 12111b and 12112b constituting the first portion of the jaw of the comb also presents a profile that is asymmetrical and that comprises on either side of the corresponding central edge A11b, A12b:
a first wall extending with a first general angle of incidence relative to the general plane of the projecting element so as to co-operate with a first side of the substrate that the housing is to receive when the jaws close onto it; and
a second wall extending with a second general angle of incidence relative to the general plane of the projecting element so as to co-operate with a second side of the substrate, which second angle of incidence is greater than the first general angle of incidence.

The first general angle of incidence is small, being of the order of a few degrees, such that the first wall is practically perpendicular to the surface of the member carrying it.

The second angle of incidence is much larger, such that the second wall defines a more "open" half profile for the housing, the second wall sloping very progressively from the bottom of the housing towards the projecting rim of the first wall of the adjacent housing.

The central edges A11b, A12b are designed to engage in the substrate received by the housing in the cleavage plane of the substrate (it is explained below how each housing receives a substrate).

This engagement takes place when the jaws of the first comb clamp onto the substrates. The concave shape of the housings and the presence of the central edge thus enable the first portions of the jaws of the first comb 121 to engage each substrate between its two wafers.

Because of the asymmetrical profile of the housings, while this clamping is taking place, the wafer of the substrate on the first side of the substrate has a degree of freedom in movement relative to the first portions 121a, 121b of the first comb and in the direction perpendicular to the general plane of the projecting element that is smaller than the degree of freedom available to the wafer of the substrate which is on the second side of the substrate.

In other words, while this clamping is taking place and relative to the first portions of the first comb, for each substrate, the wafer that is on the first side of the substrate is wedged between the central edge of the housing and its first wall, i.e. its wall that is at a steep slope relative to the bottom of the housing.

At the same time, the other wafer of the substrate has a greater degree of freedom to move relative to the first portions of the first comb in the direction perpendicular to the general plane of the projecting element, i.e. in the direction perpendicular to the plane of the wafer.

Thus, one of the wafers of the substrate is wedged relative to the member that engages it, while the other wafer is potentially capable of moving away from the first wafer.

It is specified that the walls and the edges in the housings of the first and second members of the first portion of the first comb are in vertical alignment so that both members have the same effect on each substrate.

In similar manner, the housings L2b of the second jaw portion 1212b likewise present a profile that is asymmetrical relative to their respective central edges A2b.

In this case also, the central edges of the housings are designed to engage the substrates at their cleavage plane, while the second jaw portions of the first comb are clamping onto the substrates.

While this clamping is taking place (which in a preferred embodiment of the invention occurs simultaneously with the clamping of the first jaw portions of the first comb, the jaws of the first comb closing on a single occasion), the edges of the first and second jaw portions of the first comb are in vertical alignment.

It will also be seen that this alignment occurs only in a reference position between the first and second jaw portions of the comb 121, which reference position is the position of the jaw portions while the jaws of the first comb are clamping together.

As a result, while the first comb is clamping onto the substrates, each substrate is engaged by the edges of the first and second portions of the first comb in its cleavage plane.

For each housing of the second jaw portion of the first comb, there is to be found in the same manner on one side of the edge a "steep" wall which wedges one wafer of the substrate, and on the other side an "open" wall which gives the other wafer a certain amount of freedom to move away from the first wafer which is wedged, relative to the second portion 1212b.

However, the housings of the second portions of the first comb are of a profile that is reversed relative to the profile of the housings of the first portions of the first comb.

Thus the "steep" wall of a housing of the second jaw portion of the first comb is in vertical alignment with the "open" wall of the corresponding housing of the members of the first jaw portion of the first comb.

Symmetrically, the "open" wall of a housing of the second portion is in vertical alignment with the "steep" wall of the corresponding housing of the members of the first portion.

Thus, the wafer of the substrate which is on the side of the substrate, and which is wedged relative to the first jaw portion 1211b between the central edge and the "steep" wall of the two housings of the members 12111b and 12112b has a degree of freedom to move away from the central edge A2b of the corresponding housing of the second jaw portion 1212b, moving away from same edge.

The other wafer of the substrate is wedged relative to the second jaw portion, but has a degree of freedom to move away from the central edges of the housings of the members of the first jaw portion.

The main structural characteristics of the machine 1 are described above, corresponding to a first main embodiment of the machine of the invention.

The operation of the machine is described below with reference still to FIGS. 1 to 4.

Starting from a situation in which:

the boat N contains 25 substrates S each of which has been subjected to cleaving (which cleaving might optionally need finishing off mechanically, in any event, the two wafers of each substrate are to be split apart in accordance with the invention);

the assembly 12 is in register with and over the station ST1 (following appropriate displacement in the direction X of FIG. 1); and the jaws of the combs 121 and 122 are spaced apart and open, the first operation is to cause the pusher associated with the station ST1 to move upwards.

This pusher picks up the substrates, with each substrate being received in a housing of the pusher (which is to be found under the substrate for this purpose, the housings furthermore being provided with V-shaped slopes so as to form a funnel in which a substrate is received).

The bottom of each housing of the pusher has a central edge (thereby defining a housing with a "W-shaped" profile), the edge thus being positioned in the annular cavity of the cleavage plane in the substrate.

It should be understood that the term "W-shaped" designates any shape which is generally concave and that further includes a profile projecting from the bottom of its concave shape.

The position of the substrate relative to the pusher is thus automatically adjusted by co-operation between shapes (the annular cavity of the cleavage plane engaging on the tip of the "W-shape", and the symmetrical slopes of the sides of the housing in the pusher being sufficiently shallow to hold the substrate in the vertical position).

The pusher of the station ST1 thus raises the substrates into a high position in which the centers of the substrates lie at the same height as the vertically-central centers of the second portions of the first comb 121.

In this high position, the substrates lie between the two jaws of the comb 121, which jaws are spaced apart, and thus open.

The jaws 121a and 121b of the first comb 121 are then caused to clamp together in synchronous and symmetrical manner so as to close the jaws of the first comb onto the substrates.

The housings of the first comb are disposed in such a manner that each of them receives one substrate during this closure.

Still during this closure, co-operation between the shapes of the first and second jaw portions of the first comb causes each substrate to be split apart into two disjoint wafers.

As explained above, while the first and second jaw portions of the first comb 121 are clamping together, the central edges of the housings in the various portions of the first comb 121 keep the cleavage plane of each substrate in a position that is fixed by becoming engaged with the substrate.

For each substrate, the first wafer has a degree of freedom to move away from the other wafer, relative to the first jaw portions of the first comb, while the other wafer has a similar degree of freedom relative to the second jaw portions of the first comb.

The central edges in the housings of the first comb 121 thus act as wedges engaged in the cleavage plane, so those degrees of freedom are used by the two wafers of each substrate to move apart from each other, thereby causing the substrate to be split completely apart.

Thus, one of the functions of these central edges in the housings of the first comb 121 is to define a kind of fixed position for the cleavage plane of each substrate in the first and second portions of the first comb 121, while leaving the wafers of each substrate a degree of freedom to move apart from each other.

Thus, co-operation between the shapes of the jaws of the first comb causes the two wafers of each substrate to become spaced apart.

This function of the central edges in the housings of the first comb 121 greatly facilitates moving the two wafers of each substrate apart; when cleavage between the two wafers is already "complete" (i.e. when the wafers of the substrate remain adjoining each other solely under the effect of "suction-cup" type or Van der Waals forces), then it serves to cause the wafers to move apart completely, the wafers moving away from each other because of their relative freedom.

In contrast, when cleavage between the wafers as presented to the machine has not already been "completed", it is possible to make provision for the clamping together of the edges to serve only to put the substrates into the correct position.

Under such circumstances, the above-mentioned urging apart of the wafers is not sufficient actually to split the wafers apart, with this being achieved only when the second jaw portions of the first comb are moved in translation through one-half of the reference pitch, as described in greater detail below.

It is also possible to adapt the characteristics of the machine (shape of the edges, clamping force, . . . ) so that during clamping, the wafers are split completely apart, even for a substrate in which cleavage has not been completed.

In any event, the shape of the profile of the central edges and the clamping movements of the jaws can be adapted so as to act on both of the functions of the edges (positioning only and positioning associated with splitting apart by a wedging effect).

It is also possible to adapt the clamping movements of the jaws of the first comb in desired manner so as to split the wafers apart under good control in order to avoid damaging the wafers.

In particular, provision can be made to associate the jaws of the first comb with force sensors for stopping clamping of the jaws in the event of the substrates resisting too strongly.

Under such circumstances, one or more substrates might be difficult to split apart and it may be preferred to interrupt operations in order to avoid damaging the substrates: it is then possible to identify and remove the "uncooperative" substrates and continue splitting the other substrates apart.

It is also possible to associate such clamping with sensors of a different type, for example optical sensors, to verify that the substrates are being split apart properly and stop the machine if that is not the case.

The pusher of ST1 is then lowered, empty, and retracted into the base 11 so that the substrates are held solely by the jaws.

When the substrates for splitting apart include a layer of material such as silicon bonded to a stiffener (with the cleavage plane of the substrate being defined in the silicon and the substrate constituting two wafers on either side of the cleavage plane), the bonding interface between the layer and the stiffener can assist in achieving good initial positioning of the central edges of the housings of the first comb 121 when the jaws of the comb begin to clamp together.

Such an bonding interface defines an annular chamfer which is the result of a small amount of rounding at the edges of the layer of silicon (or some other material) and of the stiffener (rounding which can be observed in a radial section through the disk-shaped substrate).

The two rounded edges face other and thus define an annular chamfer.

The inventors have observed that the central edges of the housings in the first comb 121 then become engaged in the annular chamfer.

This engagement is made easier by the fact that at the beginning of jaw clamping, the substrate has a certain amount of freedom to move in the storage direction of the substrate.

When the edges of the first comb come into contact with the substrates, the substrates automatically adjust their positions in the storage direction of the substrate so as to facilitate such engagement at the bonding interface.

The inventors has also observed that when the jaws of the first comb continue to be clamped onto the substrates, the wafers are indeed split apart on the cleavage plane.

Thereafter, the second jaw portions of the first comb are caused to move in translation through half a reference pitch.

Figure 3:
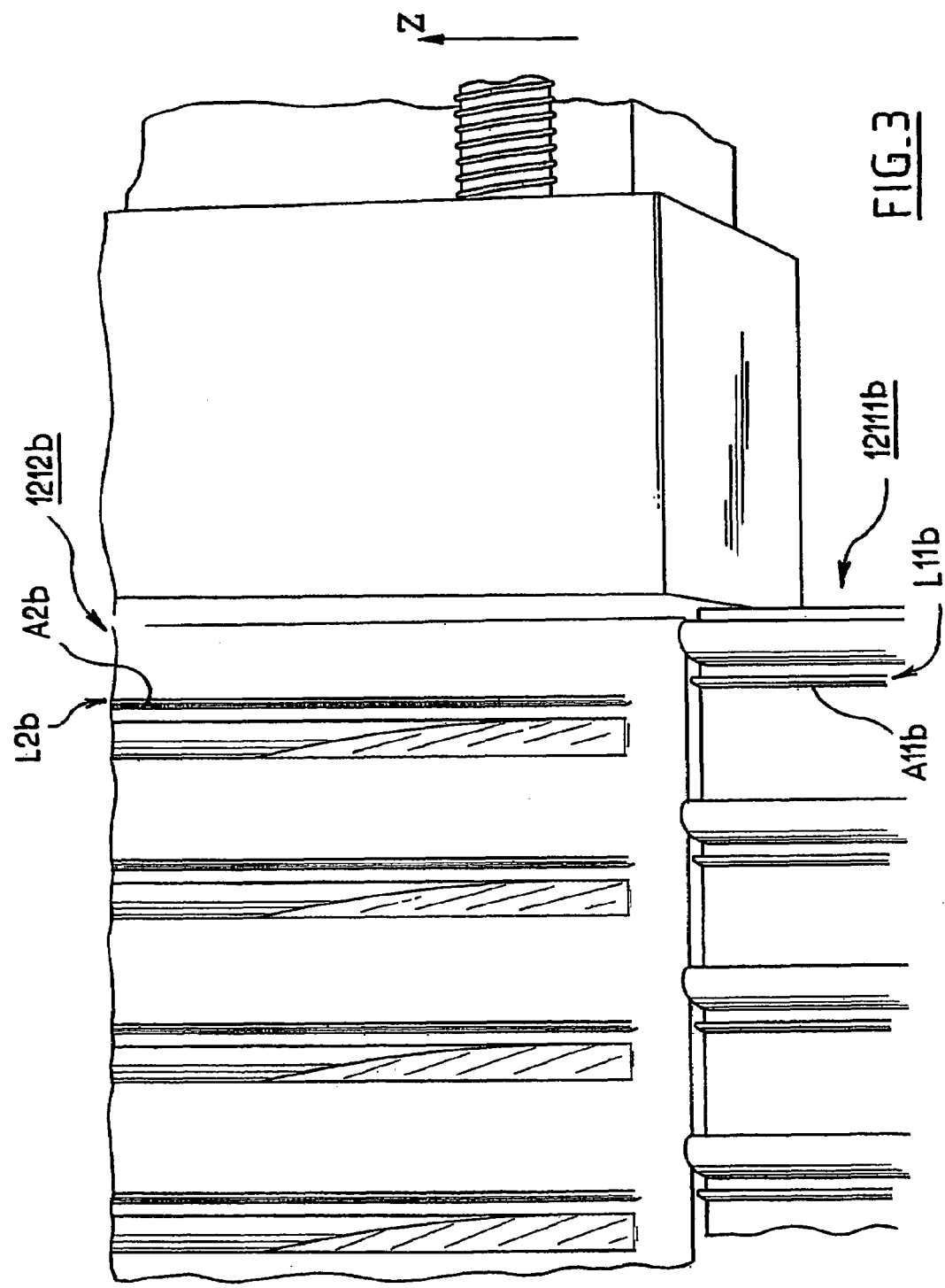
Figure 4:
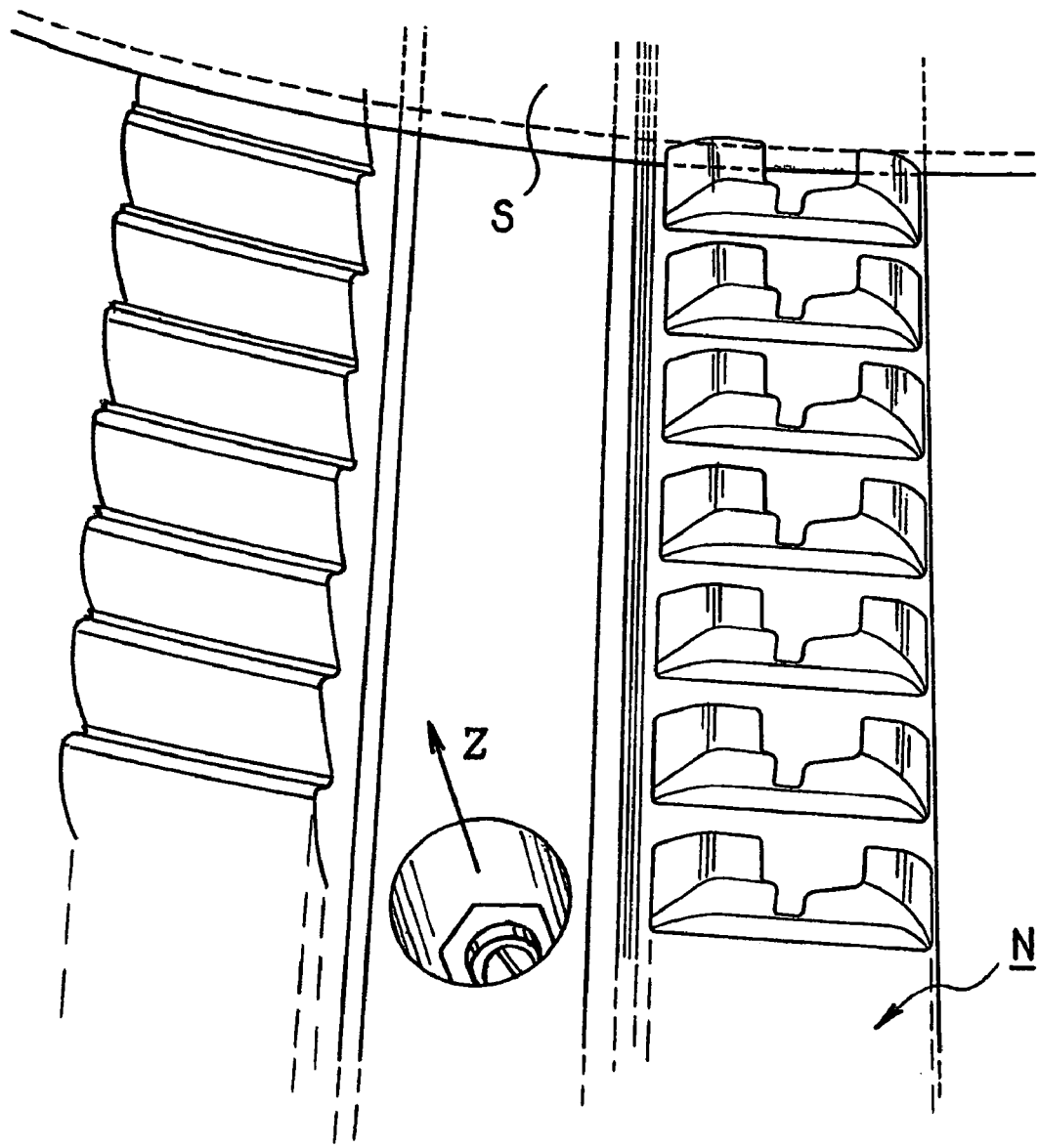

This controlled movement in translation is performed in the direction of arrow T in FIG. 3 (i.e. in a direction substantially parallel to the storage direction of the substrates), such that during this movement in translation, the "steep" walls of the first and second portions associated with the same substrate and already disposed on opposite sides of the substrate move further apart.

As a result, the central edges in the housings of the second portions move the wafer of each substrate that was wedged in the housings so as to move it further away from the other wafer of the substrate.

As mentioned above, this movement takes place over a distance that corresponds to half the reference pitch; at this stage, the wafers are thus regularly spaced apart at half the reference pitch, with the two wafers of the same substrate facing each other via their front or active faces (the faces that have been cleaved apart).

However since the first comb is closed onto the wafers (and has indeed caused every other wafer to move through half a reference pitch), the first comb now holds the wafers with this offset.

As described below, this function of controlled offsetting of every other wafer makes it possible to continue in particularly simple and easy manner with steps of handling the plurality of wafers once they have been split apart.

Naturally, it is possible to arrange for the part that is movable in the direction of arrow T not to be the second jaw portions of the first comb, but to be the first portions of the jaws, the important point being to obtain controlled movement between those two portions.

Thereafter, the assembly 12 is moved in the direction X of FIG. 1 by its control means until it comes over the station ST2. The first comb 121 has taken with it the 50 wafers that are regularly spaced apart at half the reference pitch.

Thereafter, the pusher associated with the station ST2 is raised so as to come into contact with the bottom edges of the wafers, the 50 housings of this pusher being offset by half the reference pitch, and each receiving one wafer.

In this position, the pusher associated with ST2 supports all 50 wafers.

The jaws of the first comb 121 are then caused to open while the jaws of the second comb 122 are caused to close onto the wafers (during these operations all 50 wafers continue to be supported by the pusher ST2).

Each of the jaws 122a, 122b of the second comb 122 has 25 teeth D (see FIG. 2) that are regularly spaced apart along the long direction of the jaw, with each tooth being separated from the following tooth by a distance corresponding to the reference pitch.

Each tooth has a flared slot forming a housing for receiving one wafer. It will be seen (in particular in FIG. 1), that since the comb 122 is beneath the comb 121 (which itself is in register with the middle regions of the substrates and the wafers when they are in the high position), the slots of the teeth receive the bottom portions of the wafers, and are therefore capable of supporting them.

The slots are in register with wafers that are held by the pusher of ST2, with every other wafer being received and held in a slot of the second comb once it has closed.

The teeth D are separated by gaps E (see FIG. 2) themselves regularly spaced apart at the reference pitch.

The dimensions of these open gaps are such as to ensure that they do not form an obstacle to lowering the wafers that have not been received in the slots of the comb 122.

The pusher of ST2 is then lowered, and 25 of the wafers remain held in the high position by the comb 122, whereas the other 25 wafers move down with the pusher.

The comb 122 thus acts as a "filter" intercepting every other wafer: only those wafers that have not been offset by moving the second jaw portions of the first comb in translation are received in a slot of the second comb.

More precisely, this comb always retains a wafer of the same kind from each substrate (e.g. the wafer which corresponds to the SOI wafer or the SOA wafer), and the same applies to the pusher of ST2 (which in this case retains the wafer of each substrate that corresponds to the remainder of the silicon).

The pusher of ST2 continues to move downwards until it has placed all 25 wafers of the remaining silicon in the cassette K2, and has passed through the cassette so as to be retracted into the base 11.

The assembly 12 is then moved into register with the station ST3. The second comb 122 thus takes with it the 25 wafers that it is carrying so as to bring them into register with this station.

The pusher associated with ST3 is deployed upwards so as to occupy a high position in which each of the 25 wafers held by the comb 122 is received in a housing of this pusher.

The second comb 122 is then opened so as to release the 25 wafers (SOI or SOA wafers in this example), which wafers are then held by the pusher of ST3.

This pusher is then lowered so as to pass through the cassette K3, thereby depositing the 25 SOI or SOA wafers in the cassette. The pusher of ST3 is then retracted into the base 11.

It can thus be seen that the invention makes it possible to split substrates apart in advantageous manner, and in particular with the following advantages:

rates of processing throughput are considerably increased compared with prior art systems. The invention serves to split a plurality of substrates apart simultaneously (e.g. 25 substrates, although this figure is not limiting).

In this respect, it should be specified that it is possible to adapt the shape of the jaws of the first comb and/or their relative positions, and/or the dynamics with which they are clamped together so that the substrates are not split apart simultaneously (all of the substrates being split apart at the same time), but sequentially (i.e. the substrates being split apart one after another, with time offsets that are controlled between two adjacent substrates being split apart).

For this purpose, provision can be made, for example, for the opposite jaws of the first comb not to be parallel when they are in the closed position, but to form a narrow V-shape with an angle at the apex selected so that the jaws of the comb engage the substrates successively one after another as the jaws are being clamped together.

This option can be implemented in particular when splitting apart substrates which are difficult to split apart. Under such circumstances, it is also possible to associate the clamping together of the jaws of the first comb onto the substrates with a sensor (optical or other) that observe the substrate that is currently being split apart (e.g. by moving along the substrate storage direction so as to be in register with a substrate as it is being split apart under the clamping effect of the jaws), thus making it possible with a suitable feedback loop to interrupt clamping in the event of a problem being observed on any substrate that is in the process of being split apart;

substrates are split apart with a high degree of accuracy, and with a high degree of safety for the wafers. In particular, the invention makes it possible to avoid any risk of scratching the faces of the wafers that have been split apart;

the invention also makes it possible to handle the wafers that have been split apart automatically, with the respective wafers of each substrate being stored in cassettes provided for this purpose; and implementation of the invention can be adapted as a function of the substrates that are to be split apart. In particular, when the substrates are not completely cleaved so that it is necessary to deliver additional energy so as to allow the two wafers to be split apart, it is possible to decide to implement the clamping of the first comb in such a manner as to position the substrates—thereby facilitating subsequent splitting apart, but without actually splitting them apart since the force moving the two wafers apart that results from clamping the jaws together is not sufficient to move the wafers apart—with the substrates subsequently being split apart by the offset through half a reference pitch between the two portions of the first comb—with the stresses induced in the substrates during this offset displacement corresponding to the additional energy needed for moving the wafers apart.

Naturally, the invention described above can be implemented in various different ways.

In particular, it is possible to follow the splitting-apart operation performed in station ST1, and the degrouping of the wafers that follows the movement apart by unloading half of the wafers (one wafer from each substrate) not in the station ST2, but in the end station ST3.

In which case, the second wafer of each substrate will be unloaded by the moving assembly 12 in station ST2.

This makes it possible to terminate the operating cycle of the machine with the moving assembly in register with the middle station ST2.

This also makes it possible to select which wafer of a substrate is to be deposited in each station: for example, when splitting apart substrates that include an SOI wafer, it may be desired to place the SOI wafers in ST2 and the remaining silicon in ST3.

Since the second comb 122 always retains the same wafers, the operation of the machine needs to be adapted accordingly, by selecting which is the first station for unloading.

It should also be specified that it is possible to implement such a machine using only two stations, three not being essential.

Under such circumstances, the stations ST2 and ST3 "coincide" with only one station being provided for unloading the wafers after they have been split apart.

Under such circumstances, after the machine has unloaded the first wafers, an operator needs to take away the cassette which has just been filled with wafers and replace it with another cassette, an empty cassette, that is to receive the other wafers from the machine.

With reference below to FIGS. 5 to 8, there follows a description of a second machine enabling the invention to be implemented in a second main embodiment.

Figure 5:
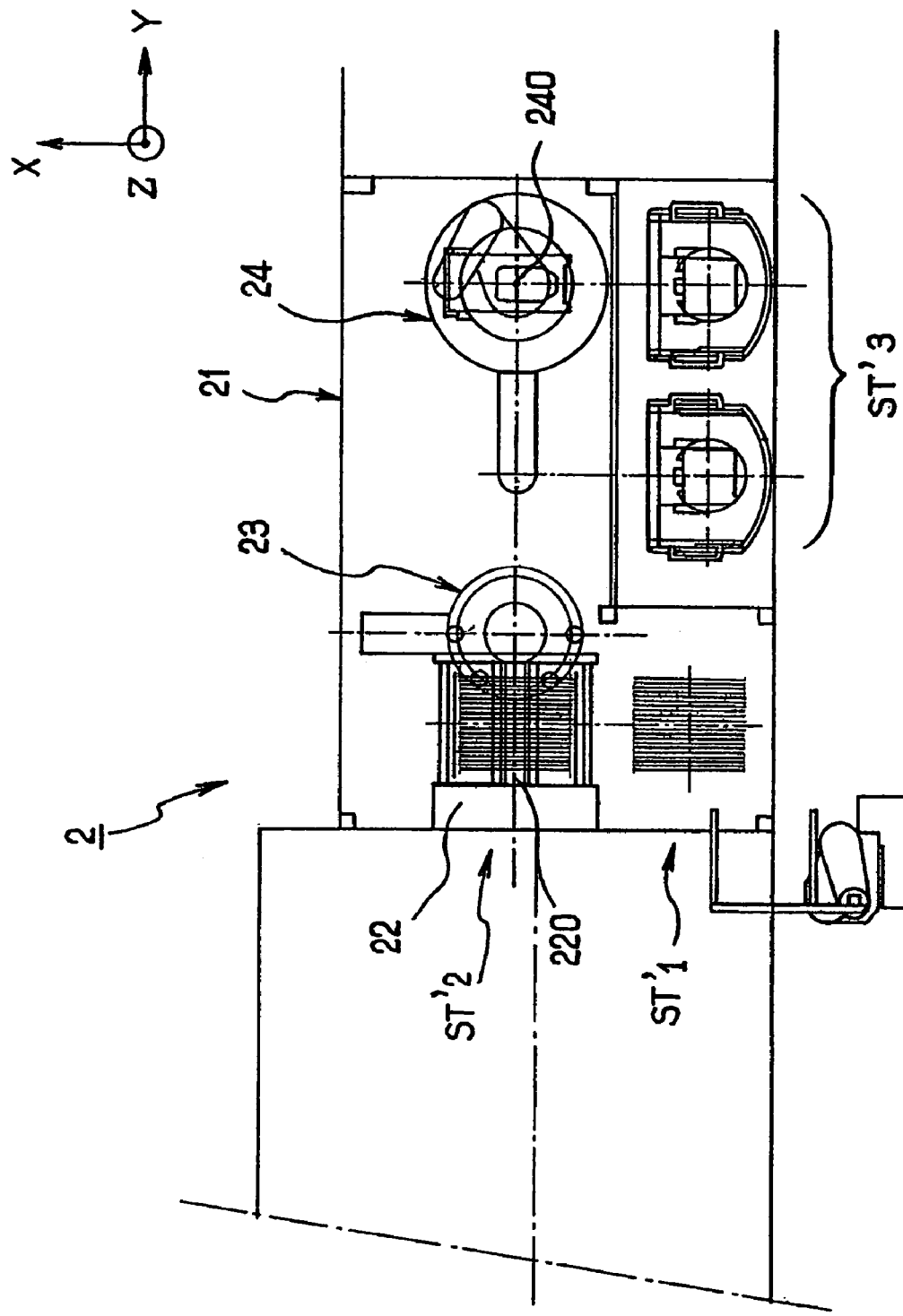
FIGS. 5 to 8 are views of another machine enabling the invention to be implemented in a second main embodiment of the invention. More precisely, in these figures.

FIG. 5 is a diagrammatic overall view of such a machine 2, as seen from above.

In this case, the machine 2 likewise comprises a fixed base referenced 21, together with a moving assembly referenced 22.

The fixed based 21 has three main stations ST'1, ST'2, and ST'3.

The station ST'1 is a station for splitting substrates apart; it is suitable for receiving a boat which may be similar to the boat N in FIG. 1, and this example repeats the situation in which 25 substrates are split apart (simultaneously or otherwise), which substrates are stored in alignment at a reference pitch.

The storage direction of the substrates is represented by arrow Y in FIG. 5.

The machine 2 is likewise adapted to splitting all types of substrate apart (SOI, SOA type substrates, and also substrates of any other type; and substrates of any size). For example, such a machine could be used for splitting apart wafers of SOI or SOA that have a diameter of 300 mm (although this example is not limiting).

The station ST'2 is a wafer unloading station: it is suitable for receiving a cassette which may be similar to the cassettes mentioned above. It may also receive a cassette which is fixed and which enables wafers to be tilted between the horizontal and the vertical.

The station ST'3 is a station for loading wafers which have been unloaded in station ST'2. This station ST'3 has two loading stations, each station suitable for being occupied by a front-opening unified pod (Foup) or a front-opening shipping box (Fosb).

These containers act like cassettes to store a plurality of wafers that are spaced apart at a given pitch (in this case the "reference pitch").

One of the particular features of such containers is that they store wafers horizontally and not vertically. It is also to be understood that wafers are stored therein with their active faces facing upwards.

It is therefore necessary to associate the machine 2 with means 23 for turning a plurality of wafers disposed vertically in the cassette at station ST'2 through one-fourth of a turn so that the wafers lie horizontally while continuing to be in alignment spaced apart at the reference pitch between any two adjacent wafers in the alignment.

The assembly 22 is adapted to be moved between two positions respectively in register with each of the stations ST'1 and ST'2, under the control of appropriate control means. The assembly 22 is thus moved along the direction X shown in FIG. 5.

The machine 2 further comprises a handling robot 24 for transferring the split-apart wafers that have been deposited by the assembly 22 in the station ST'2 and that have subsequently been put into a horizontal position by being turned through one fourth of a turn on leaving the station ST'2, ongoing from the station ST'2 to the station ST'3.

The robot 24 is thus movable in translation in the direction Y. It is also movable in rotation about its own vertical axis 240 so as to allow wafers to be unloaded into the containers of the station ST'3, and it is also movable in the Z direction.

The moving assembly 22 comprises a first comb whose two jaws are symmetrically opposite each other about the midplane 220 of the assembly and are adapted to close onto the wafers of a plurality of substrates.

However, in this case, the first comb is designed to impart to the wafers an offset of half a reference pitch: the housings which are provided in regularly spaced-apart manner on each jaw of the comb for receiving respective wafers are thus offset by half a reference pitch.

Figure 6:
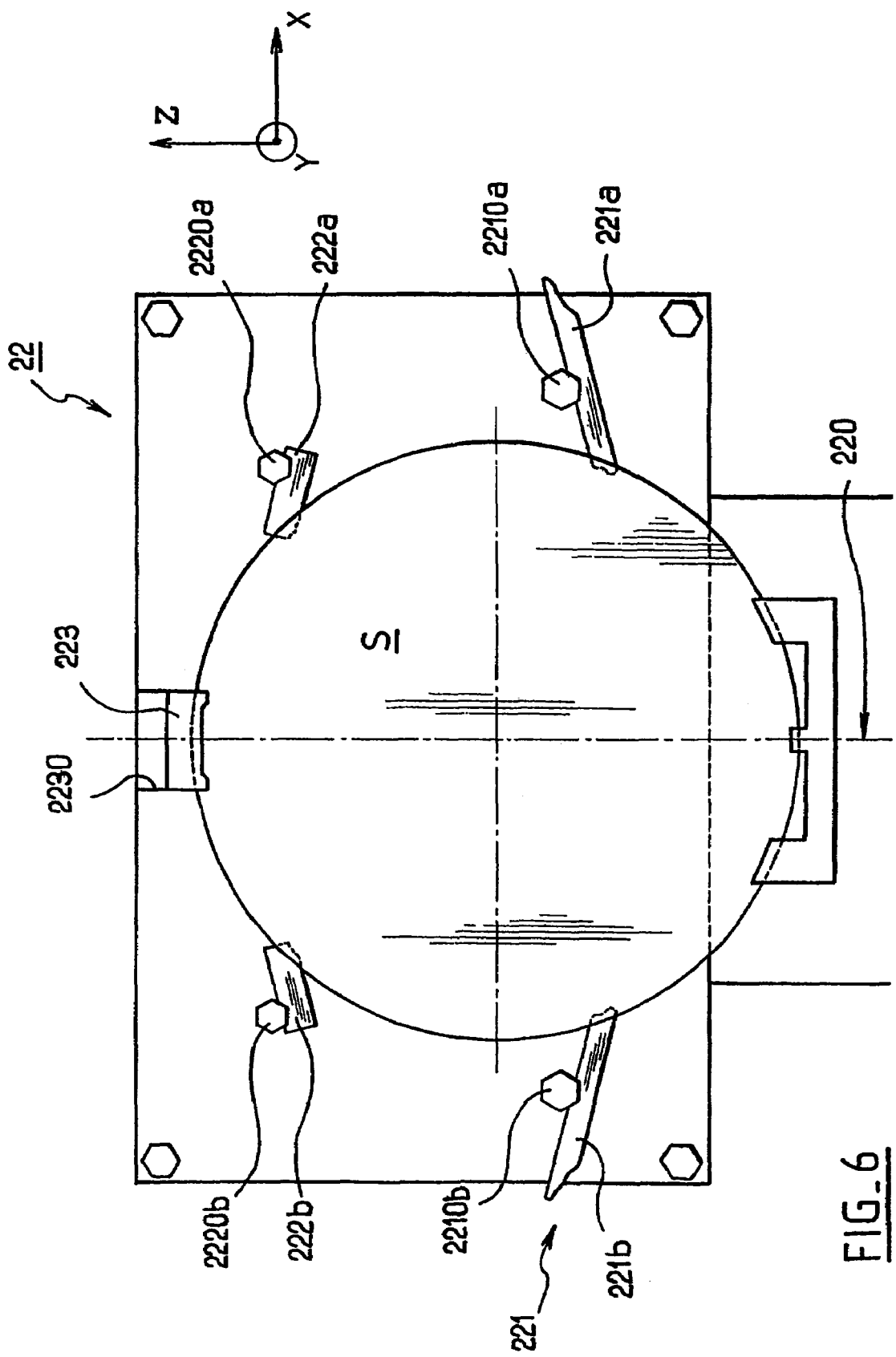

The cross-section of the facing jaws 221a and 221b of the first comb 221 is shown diagrammatically in the view of FIG. 6, which is a diagrammatic face elevation view of the main elements of the assembly 22, with a substrate S positioned in the assembly.

It can be seen that in this second machine, the jaws of the first comb do not close together by turning about a vertical axis, but by virtue of each jaw tilting about a respective horizontal axis 2210a, 2210b.

The jaws 221a and 221b can thus pivot about their respective axes between a position in which the wafers of the substrates are disengaged, and a position in which the jaws hold the wafers (each wafer being received on either side of its middle vertical axis in a corresponding housing of a jaw).

It is this holding position that is shown in FIG. 6.

In this case likewise, the two jaws are tilted synchronously so that the two jaws remain symmetrical on either side of the midplane 220.

The first comb 221 thus takes hold of the wafers after they have been split apart. This point is returned to below.

The assembly 22 also has two separation elements 222a and 222b which are likewise mounted to turn about respective horizontal axes 2220a and 2220b on either side of the midplane 220.

Each of these two separation elements has 25 blade elements disposed in the direction Y at the reference pitch so that each of them comes into register with the cleavage plane of a substrate when a plurality of substrates are put into position (see detailed description below).

Each of the 25 blades of the element 222a is in register with a blade of the element 222b so that the blades of the two respective elements face each other in pairs so as to engage the cleavage plane of a substrate on two opposite sides.

These separation elements are mounted to tilt (likewise in symmetrical manner) between a position in which the substrates are disengaged, and a position (shown in FIG. 6) in which each blade engages the cleavage plane of a corresponding substrate S.

FIG. 6 also shows a guide 223 which is arranged in the top portion of the assembly 222 above the substrates.

This guide can be mounted to slide vertically over means 2230 such as rails (it is shown below in this specification that such means 2230 are not essential).

The guide has a plurality of housings for receiving the top portions of the substrates. The guide 223 thus has 25 housings that are spaced apart in the Y direction at the reference pitch.

Figure 7:
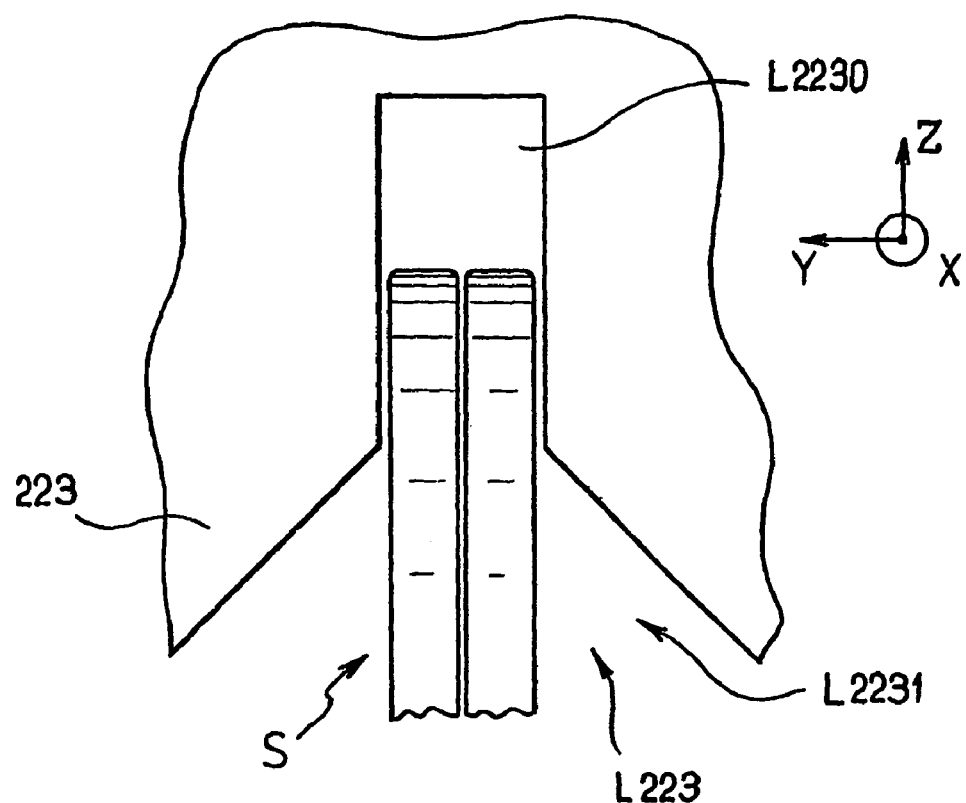

The detail shape of the guide housing 223 is shown in FIG. 7.

In this figure, it can be seen that each housing L223 has in its bottom portion a portion L2230 of width which is just greater than the thickness of the substrate S, and a conically flared portion L2231 in that portion of the housing which is situated towards the substrate (downwards).

The diagram of FIG. 7 is naturally not limiting; any configuration could thus be devised comprising a region of generally conical or converging shape and a bottom region of the housing, with the transition between the two regions having any appropriate shape.

FIG. 6 also shows the pusher P of the station ST'1. This pusher has 25 housings that are spaced apart at the reference pitch along the direction Y.

Each housing of the pusher is intended to receive a substrate. The pusher picks up the substrates in the boat which is placed on the station ST'1, passing through the boat as the pusher rises, as for the above-described pusher of the station ST1.

Figure 8:
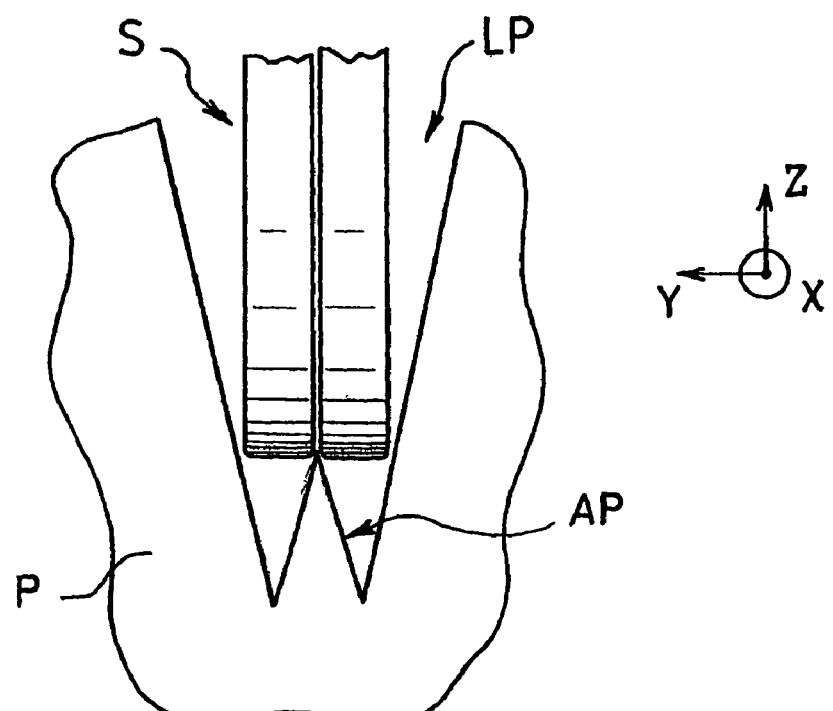

A detailed diagram of the bottom of a housing LP in the pusher is given in FIG. 8. This figure shows that the housing LP is of generally V-shaped section. It is specified that the angle of the V-shape is considerably exaggerated in the figure; in reality it may be about 4 degrees.

More precisely, the housing is W-shaped, with the symmetrical bottom of the housing including an edge AP for engaging in the cleavage plane of the substrate while the substrate is being lifted by the pusher.

The engagement of this edge in this cleavage plane thus acts like the above-described pusher of ST1 to adjust the position of the substrate by automatically centering the substrate as it is lifted by the pusher.

Returning to the moving assembly 22, this assembly also has a second comb (not shown in the figures) which corresponds to the second comb 122 of the first machine as described above.

Each of the two opposite jaws of such a comb likewise comprises in this case:

25 housings spaced apart at the reference pitch; and 25 gaps likewise spaced apart at the same pitch and interposed between the housings so as to allow every other wafer to pass through when a set of 50 wafers spaced apart at half the reference pitch is passed down through this comb.

This comb may close in the same manner as the comb 122, or by tilting like the first comb 221. It is independent of the first comb 221, with specific control means being dedicated thereto for opening and closing it.

There follows a description of how this second machine operates.

Before the description, it is recalled that the second machine is well adapted to splitting apart substrates of large dimensions where it is important to stabilize the position of the substrates that are being split apart in a manner that is as well-controlled as possible.

Thus, as described below, although the first comb of the first machine 1 serves simultaneously to take hold of the substrates and to split them apart, by making use of co-operation between the shapes of the elements of the comb not only for splitting the substrates apart but also for positioning them (the central edges of the various housings contributing to this result), in the second machine 2, different means are provided for positioning the substrates and for splitting them apart.

It is nevertheless emphasized that this second machine can be implemented for splitting apart substrates of any size.

The starting situation is thus as follows:

the boat present in the station ST'1 contains 25 substrates S which have been subjected to cleavage (which in this case also either needs to be finished off or else has already been finished off, and in any event the invention enables the two wafers of each substrate to be split apart);

the assembly 22 is in register with and overlies the station ST'1 (by being moved appropriately along the direction X in FIG. 5); and the jaws of the first and second combs of the machine 2 are open.

From this position, the pusher P of ST'1 is caused to move upwards so as to pick up the 25 substrates from the boat.

As explained below, because of the W-shaped configuration of the housings in the pusher, each substrate is automatically centered in the middle of its housing and is held substantially vertically.

The pusher rises to a high position in which the top portion of each substrate is received in a housing L223 of the guide 223.

The funnel shape of the housings L223 serves to ensure that the top of each substrate penetrates into the "bottom" portion of the (upside-down) housing, thereby fixing the position of the top of the substrate.

Since the position of the bottom of the substrate is also fixed by the edge in the bottom of the pusher housing, it will be understood that this serves to control the position of each substrate accurately, with the substrate thus having no freedom to tilt or move sideways. This is particularly important for substrates of large dimensions.

Nevertheless, care is taken during this introduction of the substrates into the housings of the guides 223 to avoid bringing the substrates vertically in abutment in an upward direction against the bottoms of the housings of the guide (see FIG. 7). This avoids stressing the substrates, which constitute elements that are extremely fine and fragile.

Once the substrates are guaranteed to be in position, the separator elements 222a and 222b are caused to tilt so that the blades of these elements come into contact with the peripheral side walls of the substrates.

It is specified that the amplitude through which the separator elements are tilted is controlled at this stage so as to ensure that they do not yet penetrate into the thickness of the substrates; at this stage, the separator elements serve only to constitute additional means for holding the substrates.

The positions of the substrates are under full control at this stage. The substrates are thus centered exactly in the desired manner.

Thereafter, the tops of the substrates are separated from the housings L223 of the guide 223. This can be the result of controlled raising of the guide on the means 2230, or the result of controlled lowering of the assembly constituted by the pusher P and the separator elements (means then being provided for performing such lowering).

It should also be understood that a guide such as the guide 223 can likewise be implemented with the machine 1 as described above and shown in FIG. 1. Such a guide can assist in positioning the substrates accurately.

In any event, once the substrates have been disengaged from the guide, they are still positioned in controlled manner by the pusher and by the separator elements.

The separator elements are then caused to tilt further towards the insides of the substrates so that the blades of these elements attack the substrates at their cleavage planes.

This "attack" can consist in causing the blade to penetrate to a depth of millimeter order into the thickness of the periphery of the substrate. The separator elements are caused to tilt so as to obtain the desired depth of penetration.

This attack results in the two wafers of each substrate being split apart. In this respect, the cross-section of the separator elements can be adapted to form projecting wedges which are plunged into the cleavage planes of the substrates.

By disengaging the substrates from the guide, it is possible for the two substrates to move apart from each other. More precisely, once the two wafers of each substrate are split apart from each other, they fall against the flanks of the bottom of the corresponding housing in the pusher P.

The only element of the assembly 22 with which the wafers co-operate are then the housings in the pusher P.

Because of the general V-shape of these housings, the two wafers of each substrate are thus disposed in a V-configuration in the bottom of the corresponding housing LP on either side of the central edge in the housing.

While the substrates are being attacked by the blades of the separator elements, sensors for measuring force and/or stroke are associated with these elements so as to measure the resistance put up by the respective substrates against being split apart (and/or against the blades advancing).

Means may be provided for interrupting blade penetration or for adapting the speed of penetration as a function of such measurements.

As in the case of the first machine described above, when splitting apart substrates that include a bonding interface (with a stiffener or some other item), the initial attack of the separators is performed at the interface, with stresses subsequently being transferred to the cleavage plane.

Thereafter, the jaws of the first comb are caused to tilt inwards so that these jaws close on the 50 separated wafers.

Since the 50 housings of these jaws are spaced apart at half the reference pitch, this clamping together of the jaws of the first comb on the wafers:

causes the wafers to be offset at half the reference pitch; and subsequently holds the wafers regularly spaced apart at half the reference pitch, with the active faces of the wafers from any given substrate then facing each other (as is the case for the machine 1).

In order to enable the wafers to be offset in this way to half the reference pitch (i.e. every other wafer must move through half the reference pitch in the direction Y—which corresponds substantially to the storage direction of the wafers and the substrates and to the long direction of the jaws), the entrances of the housings in the jaws of the first comb are flared.

Another element encouraging this displacement of every other wafer is the fact of the wafers being inclined in the housings of the pusher once they have been split apart, and thus enjoying a degree of freedom of movement in the direction Y.

Finally, simultaneously with clamping together the jaws of the first comb, the pusher is caused to move downwards so as to release the wafers progressively, thus enabling them to be stood up vertically and to be spaced apart at half the reference pitch.

At this stage, the wafers are thus regularly stored with an offset of half the reference pitch in the jaws of the first comb.

The pusher of ST'1 terminates its downward stroke and is retracted into the base 21.

The assembly 22 is then moved from the station ST'1 to the station ST'2 where it is positioned.

At this station, the wafers are degrouped (i.e. every other wafer is taken so as to move down into the cassette of ST'2).

This degrouping can be performed in the same manner as that described above with reference to the machine 1, in this case likewise by using the second comb and the pusher of the station.

Twenty-five wafers are thus lowered into the cassette of ST'2, while the other 25 wafers remain held in the high position by the second comb.

The means 23 then cause the wafers to tilt (so that their active faces face upwards) and present them to the robot 24.

This robot subsequently deposits the wafers in one of the containers of the station ST'3 while ensuring that the wafers remain in the horizontal position.

The other 25 wafers are then retrieved by the pusher of ST'2 which is raised, with the second comb opening for this purpose.

For this purpose, the pusher of ST'2 can have 50 housings that are offset by half the reference pitch, with the housings that are used for lowering the first 25 wafers being interleaved between the housings which are used for lowering the last 25 wafers.

It is also possible to mount this pusher so that it is movable in translation in the direction Y, and to cause it to move in translation through half the reference pitch in this direction so as to come into register with the wafers that remain in the second comb. In which case, the pusher of ST'2 need only have 25 housings spaced apart at the reference pitch.

In which case, it is also possible to make provision for it to be the second comb which is moved through half a reference pitch in the Y direction.

Similarly, the cassette of the station ST'2 can be offset by half a reference pitch in the direction Y in order to receive the wafers.

This second batch of wafers is then handled by the means 23 so as to be put into a horizontal position, while simultaneously being turned through half a turn so that their active faces are on top.

The robot 24 acts in the same manner as on the first batch of wafers, bringing these second wafers and depositing them in a container of the station ST'3.

In this second main embodiment of the invention, it is possible to adapt the configuration of the various elements: thus, the axes of rotation of the jaws of the first comb 221, and of the separator can have different orientations. In addition, it is possible to make provision not only for one pair of separator elements as shown in FIG. 6, but also for a plurality of pairs, with the configuration of the separator elements being adaptable.

It will be understood that this second machine enables the same advantages to be achieved as those mentioned above with reference to the first machine.

In this case also, it is possible to adapt the shape, the disposition, and/or the speed of clamping of the comb onto the substrates so that the substrates are not all split apart simultaneously, but are split apart sequentially.

In addition, in the second machine, the specific means for holding the substrates and the way in which they are implemented enable the substrates to be stabilized and their position to be controlled finely, thus making it possible to split apart substrates of large dimensions with a high degree of safety.

It is specified that although one of the advantages of the invention is to enable a large number of substrates to be split apart at the same time by processing a series of substrates simultaneously (or with a controlled time offset), other embodiments of the invention can be implemented for splitting apart individual substrates taken separately, given that the specific configurations of the machines and the stages of their operation are advantageous in themselves: in such an embodiment, rates of throughput are increased relative to the way substrates are split apart at present, in particular when they are split apart by hand.

It will naturally be understood that the invention is not limited to the embodiments described in detail above. The person skilled in the art can thus adapt its teaching: for example, the relative movements of the pushers and the other elements of the machines described can be obtained not by raising/lowering the pushers towards certain elements of the machines (combs, . . . ), but respectively by lowering/raising the elements.

What is claimed is:

1. A method of splitting apart a substrate comprising two adjoining wafers defining between them a cleavage plane, which method comprises:
bringing the substrate into a substrate-receiving space within a splitter having first and second jaw portions; and
clamping the first and second jaw portions onto the substrate in such a manner as to hold the substrate in an essentially vertical plane and urge apart the two wafers at the cleavage plane of the substrate by co-operation between the first and second jaw portions, respectively, wherein the cleavage plane comprises structural bonds present in a zone of weakness defining a boundary between the adjoining wafers, and wherein one wafer of the substrate is retained while the other wafer is being recovered by a pusher, and the wafers are placed in separate containers.

2. The method of claim 1, wherein during the clamping, co-operation between the shapes of the housings of the first and second jaw portions also causes controlled offsetting between the two wafers of each substrate in a direction perpendicular to the cleavage plane.

3. The method of claim 2 wherein splitting occurs during the controlled offsetting.

4. The method of claim 3, wherein the controlled offsetting of the wafers after they have been split apart includes moving the second portion of each jaw in translation relative to the first portion of each respective jaw in a direction perpendicular to the cleavage plane of the substrate.

5. The method of claim 1, wherein following the clamping, the first and second jaw portions are loosened so as to release the separated wafers, while other jaws are clamped together so as to retain only certain wafers of the substrate.

6. The method of claim 1, wherein one wafer is anything on anything (AOA) type and the other wafer is a remainder of silicon on anything (SOA) type.

7. The method of claim 1, wherein the substrate is brought into the substrate-receiving space by lifting the substrate in an upward direction with a pusher.

8. A method of splitting apart a substrate comprising two adjoining wafers defining between them a cleavage plane, which method comprises:
bringing the substrate into a substrate-receiving space within a splitter having first and second jaw portions;
clamping the first and second jaw portions onto the substrate in such a manner as to hold the substrate and urge apart the two wafers at the cleavage plane of the substrate by co-operation between the first and second jaw portions, respectively, wherein the cleavage plane comprises structural bonds present in a zone of weakness defining a boundary between the adjoining wafers;
following the clamping, the first and second jaw portions are loosened so as to release the separated wafers, while other jaws are clamped together so as to retain only certain wafers of the substrate; and
wherein one wafer of the substrate is retained while the other wafer is being recovered by a pusher, wherein the pusher has a housing of a general W-shape, and the wafers are placed in separate containers.

9. A method of splitting apart a substrate comprising two adjoining wafers defining between them a cleavage plane, which method comprises:
bringing the substrate into a substrate-receiving space within a splitter having first and second jaw portions; and
clamping the first and second jaw portions onto the substrate in such a manner as to hold the substrate in an essentially vertical plane and urge apart the two wafers at the cleavage plane of the substrate by co-operation between the first and second jaw portions, respectively, wherein the cleavage plane comprises structural bonds present in a zone of weakness defining a boundary between the adjoining wafers;
wherein the substrate include a zone of weakness between a first SOI wafer and another wafer of semiconductor material, and the substrate is split along the zone of weakness, and wherein one wafer of the substrate is retained while the other wafer is being recovered by a pusher, and the wafers are placed in separate containers.

10. The method of claim 9, which further comprises clamping at least some of the split-apart substrate wafers so as to hold those wafers together for further handling.

11. The method of claim 10, which further comprises holding the substrates by means of a guide prior to splitting the substrates apart.

12. The method of claim 9, wherein the SOI wafer includes a support and the other wafer is a remaining portion of the support.

13. A method of splitting apart substrates comprising two adjoining wafers defining between them a cleavage plane, which method comprises: bringing each substrate into a substrate-reception space;
clamping together separator portions onto each substrate so as to split apart the two wafers of each substrate at their cleavage planes; and
clamping the split-apart substrate wafers so as to hold the wafers together, wherein the cleavage plane comprises structural bonds present in a zone of weakness defining a boundary between the adjoining wafers;
wherein one wafer of the substrate is retained while the other wafer from the same substrate is being recovered by a pusher, and the wafers are placed in separate containers.

14. The method of claim 13, wherein prior to clamping, the split-apart wafers are held by a substrate-reception space having a V-shaped housing.

15. The method of claim 13, which further comprises holding the substrates by means of a guide prior to splitting the substrates apart.

16. The method of claim 13, which further comprises additionally clamping the clamped wafers so that only certain wafers are retained.

17. The method of claim 16, which further comprises retaining one wafer of each substrate and recovering the other wafer of each substrate prior to placing the split-apart wafers into the separate containers.

18. The method of claim 13, wherein one wafer is anything on anything (AOA) type and the other wafer is a remainder of silicon on anything (SOA) type.

19. A method of splitting apart substrates comprising two adjoining wafers defining between them a cleavage plane, which method comprises:

manipulating a plurality of substrates disposed in a substrate-storage direction which is substantially parallel to their cleavage planes so as to align them for splitting;

splitting each substrate into wafers at their cleavage planes, wherein the cleavage plane comprises structural bonds present in a zone of weakness defining a boundary between the adjoining wafers; and imparting controlled displacement to certain wafers in a direction substantially parallel to the substrate-storage direction and cleavage planes;

wherein one wafer of the substrate is retained while the other wafer from the same substrate is being recovered by a pusher, and the wafers are placed in separate containers.

20. The method of claim 19, which further comprises handling the wafers in two batches, each batch comprising a respective wafer from each substrate, and depositing each of the two batches in a respective location.

21. The method of claim 19, wherein one wafer is anything on anything (AOA) type and the other wafer is a remainder of silicon on anything (SOA) type.

\* \* \* \* \*